(12) United States Patent
Hardacker et al.

(10) Patent No.: US 8,204,455 B2
(45) Date of Patent: Jun. 19, 2012

(54) TECHNIQUES FOR PRE-DISTORTING TRANSMITTED SIGNALS FOR A TRANSMITTER DEVICE

(75) Inventors: Robert Hardacker, Escondido, CA (US); Kenichi Kawasaki, Tokyo (JP)

(73) Assignees: Sony Corporation, Tokyo (JP); Sony Electronics, Parkridge, NJ (US)

( * ) Notice: Subject to any disclaimer, the term of this patent is extended or adjusted under 35 U.S.C. 154(b) by 698 days.

(21) Appl. No.: 12/340,518

(22) Filed: Dec. 19, 2008

(65) Prior Publication Data
US 2010/0159855 A1 Jun. 24, 2010

(51) Int. Cl.
*H04B 1/04* (2006.01)
(52) U.S. Cl. ............... 455/114.3; 330/149; 375/296
(58) Field of Classification Search ............ 455/114.3, 455/561, 260, 126, 115.1; 330/149; 375/296, 375/297
See application file for complete search history.

(56) References Cited

U.S. PATENT DOCUMENTS

| | | | | |
|---|---|---|---|---|
| 5,963,352 A | * | 10/1999 | Atlas et al. | 398/193 |
| 6,693,974 B2 | * | 2/2004 | Jin et al. | 375/297 |
| 6,738,415 B2 | | 5/2004 | Drost et al. | |
| 6,947,741 B2 | * | 9/2005 | Beech et al. | 455/430 |
| 7,248,841 B2 | * | 7/2007 | Agee et al. | 455/101 |
| 2006/0012427 A1 | * | 1/2006 | Nezami | 330/149 |
| 2008/0212725 A1 | * | 9/2008 | Tang | 375/346 |

FOREIGN PATENT DOCUMENTS

WO 2006021224 3/2006

OTHER PUBLICATIONS

C. E. Tan and I.J. Wassell; Pre Equalized OFDM for Broadband Fixed Wireless Access. www.ee.ucl.ac.uk/lcs/papers2002/LCS052.pdf. Laboratory for Communications Engineering Department of Engineering, University of Cambridge, 2002. 4 pages.

* cited by examiner

*Primary Examiner* — Lam T Mai

(57) ABSTRACT

Techniques for sending and receiving signals include pre-distorting signals before transmission across a communication path. The signals are pre-distorted as a function of a distortion on the communication path. In one embodiments, transmitter a broadcasts to receiver b and there is also a transmitter b broadcasting to receiver a. This return channel enables both transmitters a and b to have a priori information regarding the transmission medium and path the signal takes. In this way, the nature of the distortion or interference is known to the transmitter, therefore, it pre-distorts the transmitted signal to compensate for the receiver exceeding its capabilities in recovering signal.

20 Claims, 5 Drawing Sheets

TECHNIQUES FOR PRE-DISTORTING TRANSMITTED SIGNALS FOR A TRANSMITTER DEVICE

BACKGROUND OF THE INVENTION

Radio frequency (RF) receivers are typically more difficult to construct than RF transmitters. This is especially true in broadcast instances. RF receivers should be able to handle various interference issues including same frequency interference and reflections of the transmitted signal, called ghosts. There is typically a finite limit to the amount of interference or poor quality signal that a receiver can handle and still recover the original transmitted signal.

FIG. 1 shows a communication system according to the conventional art. The communication system 100 includes a transmitter 110, a communication path 120, a receiver 130 and an equalizer 140. The transmitter 110 transmits a signal [T] across the communication path 120. The receiver 130 receives a distorted signal [T]*[D] after transmission across the communication path 120. The equalizer 140 equalizes $[D^{-1}]$ the distorted signal [T]*[D]. If the distortion on the communication channel 120 is less than the recovery capability $[D^{-1}]$ of the equalizer 140, the recovered signal will be substantially equal to the transmitted signal [T]. However, if the distortion on the communication channel 120 is greater than the recovery capability of the equalizer 140, the recovered signal [T'] will not be equal to the transmitted signal [T].

SUMMARY OF THE INVENTION

Embodiments of the present technology are directed toward techniques for pre-distorting signals. In one embodiment, a method of sending and receiving signals includes determining the nature of the distortion and/or interference on a communication path. Thereafter, signals to be transmitted on the communication path are pre-distorted as a function of the determined distortion. The pre-distortion may be accomplished using various types of distortion including equalization, multi-path, amplitude, frequency, phase and other well known types.

In another embodiment, a system for sending and receiving signals includes one or more devices coupled to one or more communication paths. At least one device includes a transceiver coupled to the communication path and a pre-distortion circuit coupled to the transceiver. The pre-distortion circuit pre-distorts the signals to be transmitted by the transceiver of the given device as a function of the distortion on the communication path. When the signal is transmitted, the distortion on the communication path is at least partially compensated for by the pre-distortion introduced by the pre-distortion circuit.

In one embodiment of the present invention, a first transmitter (a) broadcasts to first receiver (b) and there is also a second transmitter (of b) broadcasting to second receiver (of a). This return channel enables both transmitters (a) and (b) to have a priori information regarding the transmission medium and path the signal takes. In this way, the nature of the distortion or interference is known to the transmitter, therefore, it pre-distorts the transmitted signal to compensate for the receiver exceeding its capabilities in recovering signal. This functionality, in accordance with embodiments of the present invention, reduces the complexity of the receiver by placing some of the burden on the transmitter. The back channel enables optimization of the original signal for the current state of the communications channel. The advantageous result is fewer bit errors and/or greater link distances when compared to an identical system without the inventive back channel and pre-distortion under the same environmental factors.

In another embodiment, a communication methodology is employed in an asymmetric system where complex modulation can be employed while using equalizers and recovery circuits having only limited complexity. In this embodiment, a training signal is sent from a sink device to a source device using a simple modulation M1. The source device, knowing the training signal, determines an equalization $D1^{-1}$ that is able to recover the training signal wherein D1 is the channel distortion for M1. The source then pre-distorts the training signal with the computed $D1^{-1}$ and communicates this back to the sink using a second order modulation M2. The sink then knowing the training signal employs a simple equalization circuit to determine another distortion amount D1' required to recover the training signal from the pre-distorted transmission, where D1'*D1 equals D2 (the channel distortion of the M2 modulated signal). Advantageously, the sink then uses M1 to transmit back to the source the computed D1' and upon which the source can compute D2 since it knows D1. Here, the source advantageously uses a simple equalization circuit and simple modulation circuit. Knowing D2, the source can use M2 to communicate large amounts of data to the sink device (as pre-distorted by D2) even though the sink device has a relatively simple equalization circuit and also a simple modulator. Alternatively, the above iterative methodology can be repeated for higher order modulations, e.g., M3, etc. Although equalization is described above, this discussion is merely exemplary. This embodiment operates equally well employing other distortion types, e.g., multi-path, amplitude, frequency, phase and other well known types.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Figure 1:
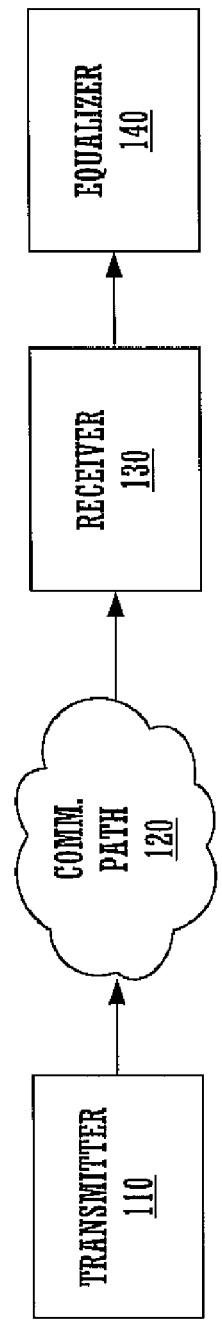
FIG. 1 shows a block diagram of a conventional communication system.
Figure 2:
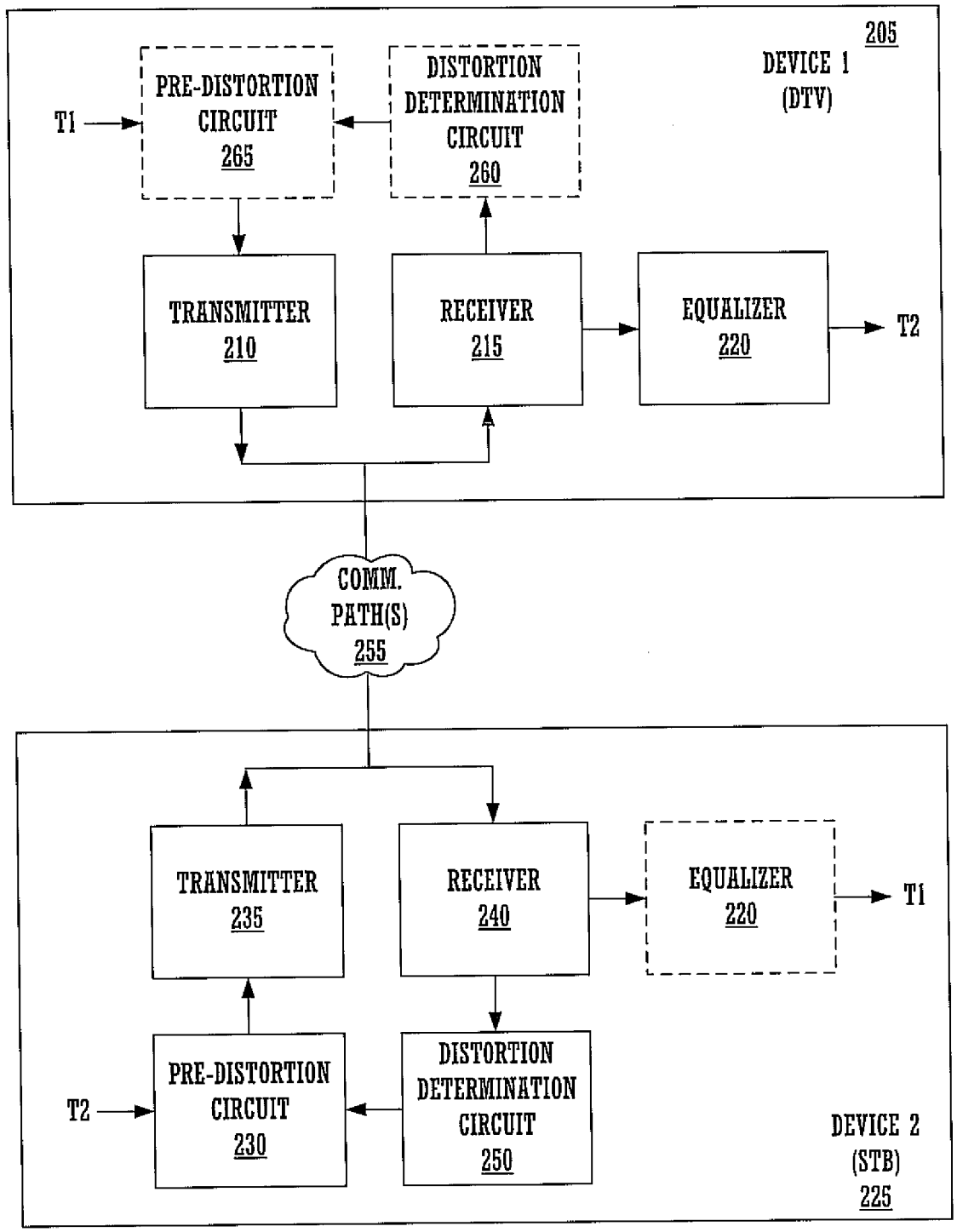
FIG. 2 shows a block diagram of a system for transmitting and receiving signals, in accordance with embodiments of the present technology.

Referring now to FIG. 2, an exemplary system for transmitting and receiving signals, in accordance with embodiments of the present technology, is shown. In one embodiment, the system includes a plurality of devices 205 and 225 communicatively coupled by a communication network. A first device 205 may include a transmitter 210, a receiver 215 and optionally an equalizer 220. A second device 225 may include a pre-distortion circuit 230, a transmitter 235, a receiver 240, a distortion determination circuit 250 and optionally an equalizer 245. The first and second devices 205 and 225 transmit and receive signals across one or more communication paths 255 of the communication network.

The communication paths may be wired links, wireless links or a combination thereof. In one exemplary implementation, the devices may be consumer electronic devices and the network may be a home multimedia network. In one implementation, the signal may be transmitted at a frequency in the megahertz (MHz) or gigahertz (GHz) range. In an exemplary implementation, the signal may be transmitted at 60 GHz. Operation of the system will be further described with reference to FIG. 3, which shows a method of transmitting and receiving signals in accordance with one embodiment of the present technology.

Figure 3:
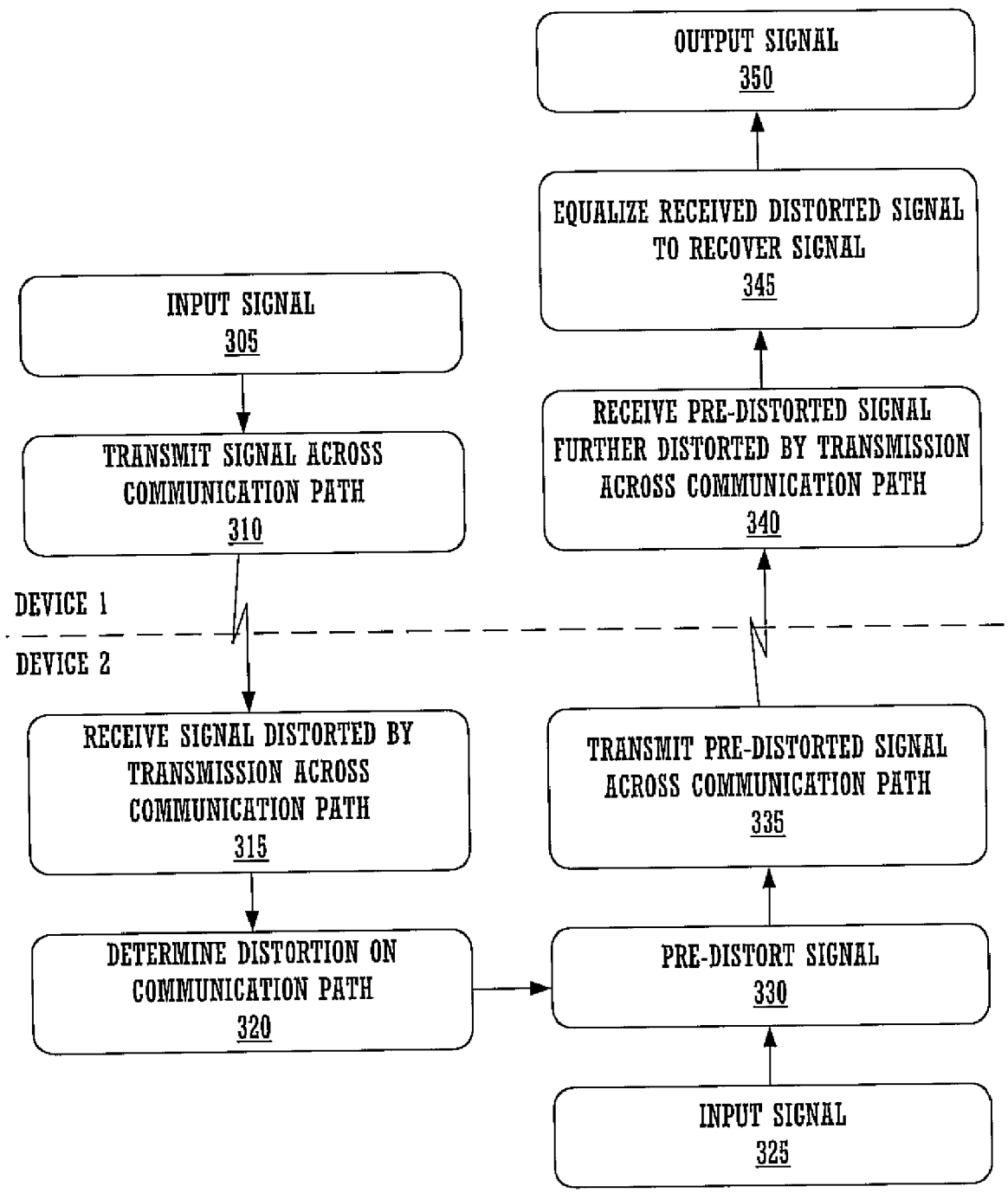
FIG. 3 shows a flow diagram of a method of transmitting and receiving signals in accordance with embodiments of the present technology.

With respect to FIG. 2 and FIG. 3, at 305, a first input signal $[T(1)]$ is presented to the transmitter 210 of the first device 205 for transmission. Alternatively, the first input signal $[T(1)]$ may be generated internally by the transmitter 21 0. The first input signal $[T(1)]$ may be any signal to be transmitted by the first device 205 across the communication path 255. In one implementation, the first input signal $[T(1)]$ is a training or configuration signal specifically utilized to determine the nature of the distortion or interference on the communication path 255. In another implementation, the first input signal $[T(1)]$ may be a predetermined control signal or general data signal that facilitates the determination of the nature of the distortion or interference on the communication path 255. For example, the signal may be a predictable control signal transmitted from the first device 205 to the second device 225

At 310, the first input signal $[T(1)]$ is transmitted across the communication path 255 by the transmitter 210. At 315, the first input signal distorted by channel distortion D(1) due to transmission across the communication path. The transmitted signal is represented here as a convolution product, $[T(1)]*[D(1)]$, and is received by the receiver 240 of the second device 225. At 320, the distortion $[D(1)]$ introduced by the communication path 255 is automatically determined by the distortion determination circuit 250 since the training signal T(1) is a known signal.

In accordance with embodiments of the present invention, the nature of the distortion or interference may then be used to pre-distort signals transmitted from the second device 225 to the first device 205 or optionally vice-versa. For example, the pre-distortion circuit 230 of the second device 225 may receive a second signal $[T(2)]$, for transmission to device 205 at 325. At 330, the second signal $[T(2)]$ is pre-distorted by $[D(1)]^{-1}$ at the pre-distortion circuit 230. The pre-distortion $[D(1)]^{-1}$ is a function of the distortion on the communication path 255 determined at process 320. At 335, the transmitter 235 in the second device 225 transmits the pre-distorted signal $[T(2)]*[D(1)]^{-1}$ across the communication path 255 which introduces a determined amount of distortion $[D(2)]$. The distortion $[D(2)]$ from the communication path 255 and the pre-distortion $[D(1)]^{-1}$ introduced by the pre-distortion circuit 230 of the second device 225 produce convolved distortion $[D(2)]*[D(1)]^{-1}$. If this convolution product=1, the recovered signal T(2) will be correct and the pre-distortion introduced by device 225 enables recovery of signal T(2) at device 205.

At 340, the receiver 215 in the first device 205 receives the pre-distorted signal $[T(2)]*[D(1)]^{-1}$ further distorted by $[D(2)]$ after transmission across the communication path 255. If the product of $[D(2)]*[D(1)]^{-1} \neq 1$ at 345, the equalizer 220 in the first device equalizes, or performs some amount of signal recovery on the pre-distorted signal further distorted $[T(2)]*[D(1)]^{-1}*[D(2)]$ by transmission across the communication path to recover the second signal $[T(2)]$. The convolved distortion $[D(2)]*[D(1)]^{-1}$ is recoverable by the equalization function $[D(n)^{-1}]$ of the equalizer 220. At 350, the recovered second signal $[T(2)]$ is output by the equalizer 220 for use by other circuits of the first device 205. It is appreciated that equalization is discussed herein as an example of a signal recovery process that may be employed. However, this embodiment operates equally well employing other forms of signal recovery, e.g., multi-path, amplitude, frequency, phase and other well known types and is therefore not limited to equalization.

It is appreciated that the equalizer 220 may be a separate circuit or integral to the receiver 215. It is also appreciated that in some instances, the pre-distortion applied by the pre-distortion circuit 230 may eliminate the need for an equalizer 220 when the nature of the distortion and/or interference on the communication path 255 can be fully compensated for by the pre-distortion circuit 230. However, in other implementations, the amount of pre-distortion applied by the pre-distortion circuit 230 does not fully compensate for the distortion on the communication path 255. Instead, the amount of pre-distortion applied is selected so that the distortion introduced by the communication path 255 is recoverable by the receiver 215 and/or equalizer 220 while reducing the complexity of the receiver 215 and/or equalizer 220. Furthermore, it is appreciated that the devices may be implemented using separate receivers and transmitters or the transmitter and receivers circuits may be implemented as an integral transceiver. It is also appreciated that the receiver and transmitter and optionally the equalizer, distortion determination circuit and/or pre-distortion circuit may be implemented as integral sub-circuits of the device or an internal or external peripheral of the device, such as a network interface card.

In one embodiment, a given application may only need pre-distortion for communication in one direction. For example, a DTV may only transmit control signals requiring a relatively low transmission rate to one or more content sources such as a set top box (STB). However, in the other direction, the set top box transmits a large amount of image data that requires a high transmission rate, which may experience high bit error rates when the distortion and/or interference on the communication path 255 is greater than a particular level. Therefore, implementing pre-distortion in the set top box may be sufficient for such a configuration. In other embodiments it may be desirable to implement pre-distortion in both devices. Therefore, the first device 205 may also include a distortion determination circuit 260 and a pre-distortion circuit 265 in the first device 205 for determining the distortion $[D(1)]$ introduced by the communication path 255 and pre-distorting signals transmitted by the first device 205.

Likewise, the second device 225 may include an equalizer 245 to recover pre-distorted signals transmitted by the first device 205.

Figure 4:
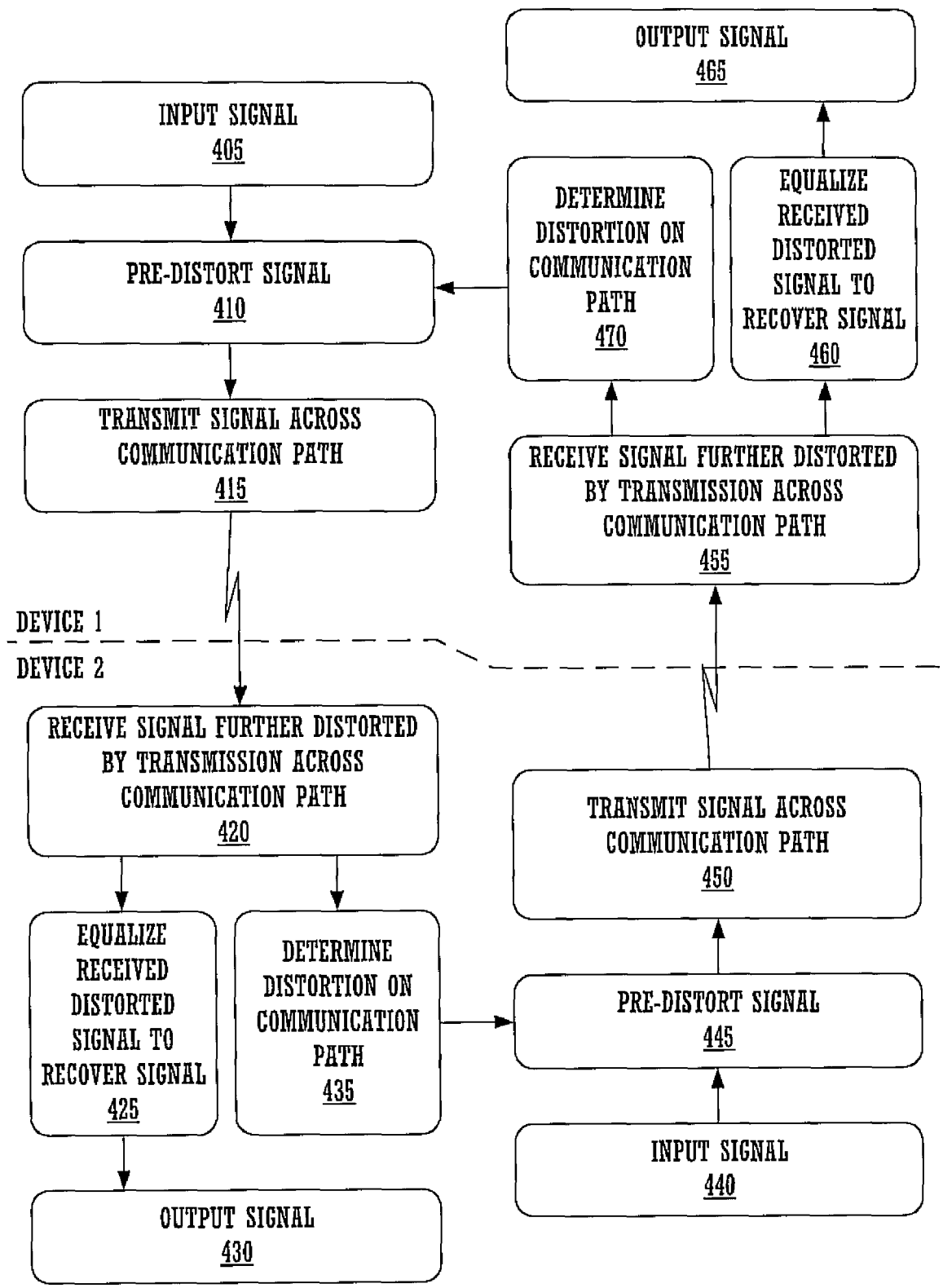
FIG. 4 shows a flow diagram of a method of transmitting and receiving signals in accordance with other embodiments of the present technology.

Referring now to FIG. 4, a method of transmitting and receiving signals, in accordance with other embodiments of the present technology, is shown. The system implementing the method of FIG. 4 may be the communications system of FIG. 2, for instance. At least one transmitter, e.g., of device 205 contains a distortion determination circuit 260 and a pre-distortion circuit 265. A back channel exists between the transmitter 235 of device 225 and the receiver 215 of device 205.

Regarding FIG. 4, at 405, there is a first input signal [T(1)] to be transmitted by the first device 205 across the communication path 255. The first signal [T(1)] is pre-distorted by [D(1)] by the pre-distortion circuit 265, at 410. The first input signal [T(1)] may be distorted based upon the nature of the distortion or interference on the communication path 255 as previously determined by the distortion determination circuit 260 during receipt of a previous signal (e.g., during process 460 described below). At 415, the pre-distorted signal [T(1)]*[D(1)$^{-1}$] is transmitted by the transmitter 210 across the communication path 255.

At 420, the receiver 240 of the second device 225 receives the pre-distorted signal [T(1)]*[D(1)$^{-1}$] further distorted by [D(1)] after transmission across the communication path 255. The received pre-distorted signal is represented as [[T(1)]*[D(1)$^{-1}$]]*D(1). At 425, the equalizer 245 of the second device 225 equalizes the received pre-distorted signal by D(1)$^{-1}$ to recover the first signal [T(1)]. At 430, the recovered signal [T(1)] is output from the equalizer 245 for use by other circuits of the second device 225. In addition, the distortion determination circuit 250 determines the distortion [D(1)] on the communication path 255, at 435. The distortion [D(1)] may be used by the pre-distortion circuit 230 to pre-distort signals (e.g., during process 445 described below). It is appreciated that equalization is discussed herein as an example of a signal recovery process that may be employed. However, this embodiment operates equally well employing other forms of signal recovery, e.g., multi-path, amplitude, frequency, phase and other well known types and is therefore not limited to equalization.

At 440, there is a second input signal [T(2)] to be transmitted by the second device 225 across the communication path 255 to device 205. The second signal [T(2)] is pre-distorted [D(1)$^{-1}$] by the pre-distortion circuit 230, at 445. The second input signal [T(2)] may be distorted based upon the nature of the distortion or interference on the communication path 255 as determined by the distortion determination circuit 230 during receipt of a previous signal (e.g., during process 435 described above). At 450, the pre-distorted signal [T(2)]*[D(1)$^{-1}$] is transmitted by the transmitter 235 across the communication path 255.

At 455, the receiver 215 in the first device 205 receives the pre-distorted signal [T(2)]*[D(1)$^{-1}$] further distorted by [D(2)] after transmission across the communication path 255. At 460, the equalizer 220 equalizes the received pre-distorted signal [[T(2)]*[D(1)$^{-1}$]]*[D(2)] to recover the first signal [T(2)]. At 465, the recovered signal [T(2)] is output from the equalizer 220 for use by other circuits of the first device 205. In addition, the distortion determination circuit 260 determines the distortion [D(1)] on the communication path 255. The nature of the distortion or interference determined by the distortion determination circuit 260 is used at process 410 to apply an appropriate amount of pre-distortion [D(1)$^{-1}$]. Again, the distortion [D(1)] on the communication path 255 may be determined for each signal received by the receiver 215 or periodically when the distortion changes over time. In another implementation, the distortion can be determined during a setup stage or when a parameter such as bit error rate (BER) exceeds a predetermined level when the distortion does not regularly fluctuate.

Figure 5:
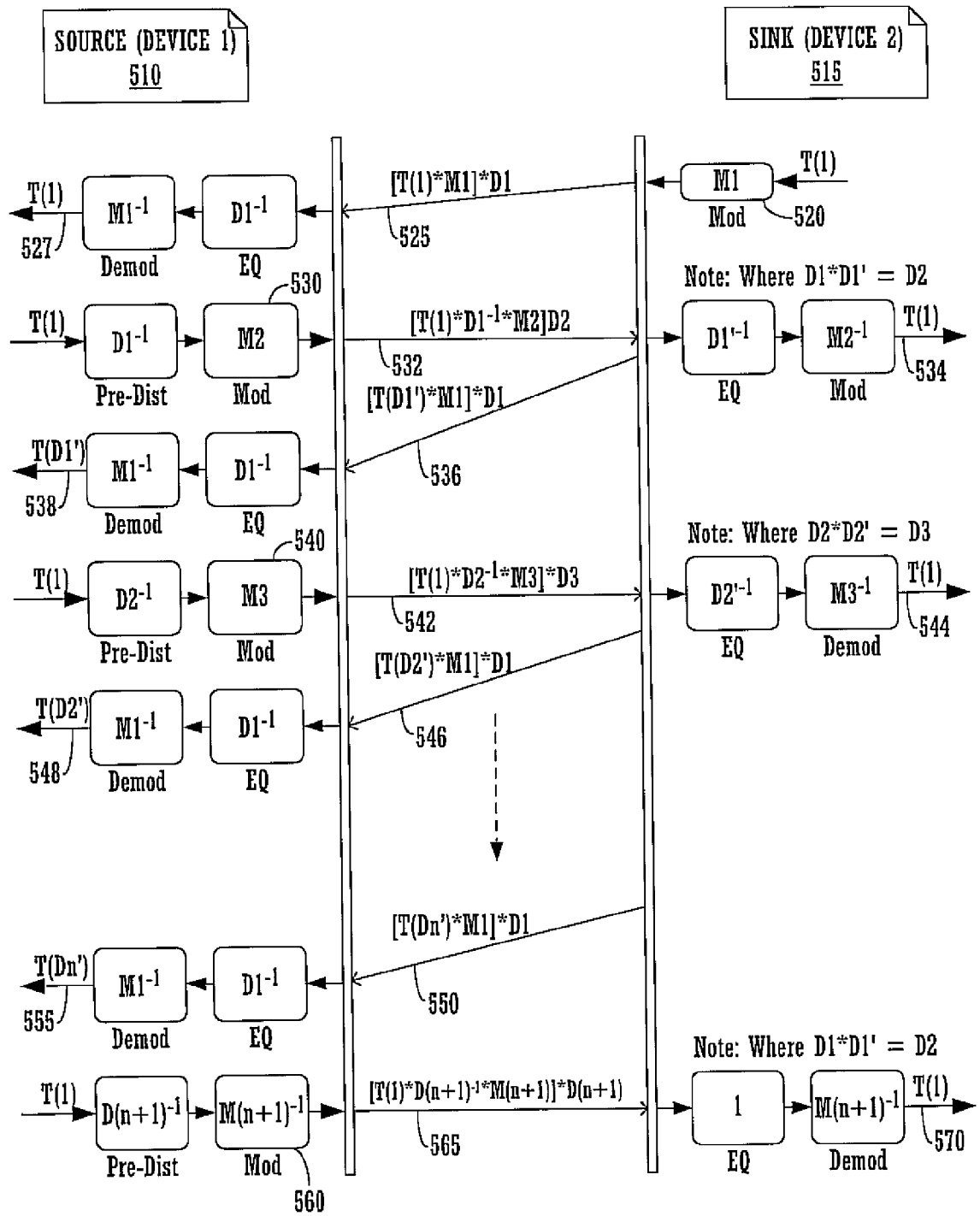
FIG. 5 illustrates a communication methodology in an asymmetric system where complex modulation can be employed while using equalizers and recovery circuits having reduced complexity.

The above described embodiments are intended for use when the distortion on the communication path 255 is substantially the same when signals are transmitted from the first device 205 to the second device 225 and from the second device 225 to the first device 205. However, in other circumstances the distortion on the communication path is not the same in both directions between two devices and may also differ between different devices. Therefore, in another embodiment (as shown in FIG. 5), data indicating the distortion determined at process 435 is transmitted from the second device 225 back to the first device 205 and used by the pre-distortion circuit 260 of the first device 205 to pre-distort the signal (T(1)) transmitted from the first device 205 to the second device 225 at process 410. Similarly, data indicating the distortion determined at process 470 is transmitted from the first device 205 back to the second device and used by the pre-distortion circuit 230 of the second device 225 to pre-distort the signal (T(2)) at process 445.

In another embodiment, a signal is transmitted from the first device 205 to the second device 225. The signal is re-transmitted (e.g., reflected back) by the second device 205 to the first device 225 pre-distorted [D(1)$^{-1}$] by the second device 225 as a verification that the pre-distortion substantially compensates for the distortion introduced by the communication path 255. In yet another embodiment, an iterative method might include using simple robust training signals that gradually increase in complexity while pre-distortion and equalization circuits keep correcting such that a complex modulation scheme (e.g., conveying higher data rates) can be possible with the dual efforts of the pre-distortion circuits and equalizer, see FIG. 5. The training signal may be known signal transmitted from one device to the other periodically. In one instance, for example, frames of data sent from one device to the other are aggregated into "superframes." Each frame may have its own forward error correction (FEC). Each superframe may have training data in the header with which to generate the current instantaneous multipath distortion for the given path. Therefore, the inverse distortion factor may be determined from the expected payload [T(1)] *[D(1)]. The inverse distortion factor [D(1)$^{-1}$] can be sent back to the other device to be used as the pre-distortion [D(1)$^{-1}$].

In one implementation, the channel frequency response is determined. The inverse of the channel frequency response may then be used by the pre-distortion circuit 430 to pre-distort signals. In another implementation, the amount of pre-distortion applied by the pre-distortion circuit 430 may be a function of the impulse response of the communication path 445. The distortion [D(1)] on the communication path 445 may be determined for each signal received by the transceiver 435, or periodically. In other implementations, the distortion can be determined during a setup stage or based on a parameter, such as when a bit error rate (BER) exceeds a predetermined level.

The signals are pre-distorted so that the distortion does not exceed the capabilities of the receiver at the other end of the channel. The techniques advantageously reduce the complexity of the receiver by placing some of the burden (e.g., circuit complexity) on the transmitter. The back channel can be exploited to compensate the original signal for the current state of the communication channel. This can result in improved performance, such as fewer bit errors and/or greater link distances, when compared to substantially similar systems without the pre-distortion modulation under substantially the same environmental factors. Accordingly, embodiments of the present technology advantageously reduce the complexity of the conventional communication interface. The reduced complexity typically translates to reduced die size of the integrated circuit implementing the communication interface and therefore may also lower the cost of the integrated circuit.

FIG. 5 illustrates a communication methodology in an asymmetric system where complex modulation can be employed while using equalizers and recovery circuits having only reduced complexity. The asymmetric system includes a source device 510 and a sink device 515. The source 510 is capable of pre-distortion and equalization. The source also advantageously supports multiple modulations from simple to complex (e.g., M1, M2, M3, ..., Mn) and also supports a simple demodulation for reduced complexity. In one embodiment, M1 may be BPSK modulation and M2 may be QPSK modulation and M3 may be 16 QAM modulation, however, any of a number of well known modulation techniques can be used.

The sink device 515 has only minimal equalization capability but supports multiple demodulations, from simple to complex (e.g., $M1^{-1}$, $M2^{-1}$, $M3^{-1}$, ..., $Mn^{-1}$). The sink 515 also supports a simple modulation scheme (e.g., M1) for the return channel back to the source 510 and may support more complex modulations optionally. The asymmetric system is advantageous in that: 1) a simple equalizer is required of the sink device 515, 2) a simple modulator is required of the sink device 515 and 3) a simple equalizer and demodulator are required of the source device 5 10. It is appreciated that pre-distortion functionality as described below is performed in the digital domain in accordance with embodiments of the present invention.

It is appreciated that equalization is discussed herein as an example of a signal recovery process that may be employed. However, this embodiment operates equally well employing other forms of signal recovery, e.g., multi-path, amplitude, frequency, phase and other well known types and is therefore not limited to equalization.

In accordance with FIG. 5, the sink device 515 sends a training signal or data packet T(1) to the source device 510 using a simple modulation M1 520. The training signal is known to the source device 5 10. The transmit signal is represented at 525 as [T(1)*M1]*D1 where D1 is the distortion of the communication channel as seen using modulation M1. Channel distortion can have phase, amplitude and multipath distortion characteristics which may all be non-linear. Herein, a distortion description, Dx, is valid for a single type of modulation, Mx, but may not be accurate for more advanced modulations, e.g., M(x+1). The source device 510 receives the signal 525 and equalizes the signal and demodulates the signal until the known training data packet T(1) is recovered at 527. Since the source device 510 knows the modulation M1 used, the equalizer is varied in a feedback loop fashion until the known training signal T(1) is recovered. When recovered, the equalizer located a good first order approximation of the channel distortion, or $D1^{-1}$. This first order approximation is good enough for the simple modulation M1.

The source 510 then sends "known" training signal or data packet T(1) using a more complex modulation M2 530 to the sink 515 and using pre-distortion $D1^{-1}$ at 532. That is, the signal transmitted by the source 510 is pre-distorted by $D1^{-1}$. This transmission is also distorted by channel distortion D2 when recovered by the sink device 515. The sink device 515 equalizes this slightly by D1' until the training signal is recovered at 534. The equalization performed at this point is not complex because the transmitted signal at 532 was pre-distorted already by $D1^{-1}$ at the source device, where $D1^{-1}$ is good enough to recover a signal modulated by M I but not enough for M2. It is noted that D2=D1*D1'. This equalization characteristic is advantageous for the sink 515 because a less complex equalizer can be used since only $D1'^{-1}$ is employed, rather than $D2^{-1}$.

At this point, the sink device 515 communicates D1' to the source device 510 using the simple modulation M1. Specifically, the sink device uses simple modulation M1 to transmit D1' to the source device at 536. This transmission 536 experiences channel distortion D1. The source device 510 already knows the channel distortion approximation $D1^{-1}$ and the modulation scheme M1, so the data packet D1' is readily recovered at 538. Since the source device knows D1' and D1, it can advantageously compute D2, a second order approximation of the channel distortion for modulation M2. Source 510 now sends T(1) again by transmission 542 but using a more complex modulation scheme, M3 540, with the transmitted signal pre-distorted by the second order pre-distortion, $D2^{-1}$. The sink 515 again has to equalize the recovered signal slightly because the $D2^{-1}$ pre-distortion is good enough for M2, but not quite good enough for M3. Equalization continues until the training signal is recovered at 544. This leads to distortion approximation D2'(D3=D2*D2'). Again, the sink 515 sends back to the source 510 (using M1) the additional equalization T(D2') necessary to decode T(1) when modulated with M3. This is shown as 546.

The source device 510 already knows the channel distortion approximation $D1^{-1}$ and the modulation scheme Ml, so the data packet D2' is readily recovered at 538. Since the source device knows D2' and D2, it can advantageously compute D3, a third order approximation of the channel distortion for M3. This third order channel distortion D3 can be used by the source device 510 to communicate large amounts of data to the sink device 515 using pre-distortion $D3^{-1}$ and modulation M3, as shown in general terms by transmission 560, 565 and 570. The above process is iterative, as shown in general terms by transmission 550 and 560, with each group of communications providing for more complex modulation while using limited equalization. The number of iterations is variable depending on the modulation required and the particular number of iterations shown in FIG. 5 is exemplary.

A result of the communication methodology of FIG. 5 is complex modulation and the corresponding complex pre-distortion that allows the receive side to use little or no signal recovery, e.g., equalization in the above example. Circuit complexity is generally linked to modulation complexity and the degree of channel distortion that is expected. However, by simplifying the receiver side embodiments of the present invention reduce the number of necessary bits in the analog to digital converter circuits which in turn reduces power consumption.

High speed analog circuitry has fewer accurate models, and is more difficult. Therefore, embodiments as shown in FIG. 5 allow the use of increasingly complex modulation schemes while not requiring a large/complex equalization circuit in the sink device 515.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A method comprising:
   determining a distortion on a communication link between a first device and a second device;
   pre-distorting, by the first device, a signal as an inverse function of the distortion determined on the communication link to produce a pre-distorted signal; and
   transmitting, by the first device to the second device the pre-distorted signal on the communication link.

2. The method according to claim 1, further comprising receiving, by the second device, the pre-distorted signal after transmission across the communication link.

3. The method according to claim 2, further comprising performing a signal recovery process, by the second device on the received pre-distorted signal after transmission across the communication link to substantially recover the signal.

4. A method comprising:
   transmitting, by a first device to a second device, a first signal wherein the first signal is a known signal;
   determining, by the second device, a first distortion amount in recovering the first signal wherein the first distortion amount represents channel distortion of a communication channel between the first device and the second device;
   pre-distorting, by the second device, a second signal;
   transmitting, by the first second to the first device, the pre-distorted version of the second signal to the first device; and
   performing a signal recovery process, by the first device, on the pre-distorted version of the second signal further distorted by the channel distortion of the communication channel between the second device and the first device to recover the second signal.

5. The method according to claim 4 wherein the first signal is transmitted using a first modulation and wherein the pre-distorted version of the second signal is transmitted using a second modulation, more complex than the first modulation.

6. The method according to claim 5 wherein the second signal is a known signal and further comprising:
   the first device determining a second distortion amount in recovering the second signal;
   the first device transmitting the second distortion amount to the second device; and
   the second device determining a third distortion amount from the first distortion amount and the second distortion amount.

7. The method according to claim 6 further comprising:
   the second device pre-distorting a third signal by the third distortion amount; and
   the second device transmitting a pre-distorted version of the third signal to the first device using the second modulation.

8. A system for communicating over a communication path comprising:
   a first device comprising:
      a first pre-distortion circuit for pre-distortion a first signal as a function of a distortion introduced on the communication path from the first device to a second device;
      a first transmitter coupled to the first pre-distortion circuit for transmitting the first signal on the communication path; and
   the second device comprising a first receiver communicatively coupled to the communication path for receiving the pre-distorted first signal further distorted by transmission across the communication path, wherein the distortion introduced by the communication path is partially compensated for by the pre-distortion introduced by the first pre-distortion circuit.

9. The system of claim 8, wherein:
   the second device further comprises:
      a first distortion determination circuit coupled to the first receiver for determining the distortion on the communication path from a training signal after transmission across the communication path from the first device to the second device; and
      a second transmitter coupled to the first distortion determination circuit for transmitting data to the first device indicating the distortion on the communication path from the first device to the second device; and
   wherein the first device further comprises:
      a second receiver communicatively coupled to the communication path for receiving the data indicating the distortion on the communication path from the first device to the second device.

10. The system of claim 9, wherein:
    the second device further comprises a second pre-distortion circuit for pre-distorting a second signal as a function of a distortion introduced on the communication path from the second device to the first device;
    wherein the second transmitter is for further transmitting the second signal on the communication path; and
    wherein further the second receiver is communicatively coupled to the communication path for receiving the pre-distorted second signal further distorted by transmission across the communication path, wherein the distortion introduced by the communication path is partially compensated for by the pre-distortion introduced by the second pre-distortion circuit.

11. The system of claim 10, wherein:
    the first device further comprises a second distortion determination circuit coupled to the second receiver for determining the distortion on the communication path from the training signal after transmission across the communication path from the second device to the first device;
    wherein the first transmitter is for further transmitting data to the second device indicating the distortion on the communication path from the first device to the second device; and
    wherein the first receiver is for further receiving the data indicating the distortion on the communication path from the first device to the second device.

12. The system of claim 11, wherein the first device comprises a first signal recovery circuit coupled to the second receiver for substantially recovering the second signal from the pre-distorted second signal further distorted after transmission across the communication path.

13. The system of claim 12, wherein the second device further includes a second signal recovery circuit coupled to the first receiver for substantially recovering the first signal from the pre-distorted first signal further distorted after transmission across the communication path.

14. The system of claim 13, wherein the first transmitter and the second receiver of the first device comprise a first transceiver.

15. The system of claim 13, wherein the second distortion determination circuit of the first device is an integral circuit of the first signal recovery circuit of the first device.

16. The system of claim 13, wherein the communication path comprises a wired communication link.

17. The system of claim 13, wherein the communication path comprises a wireless communication link.

18. The system of claim 13, wherein the communication path comprises a plurality of communication links.

19. The system of claim 8 wherein the first device and the second device are consumer electronic devices.

20. The system of claim 9 wherein the first signal is transmitted from the first device to the second device using complex modulation and wherein further the data indicating the distortion on the communication path is transmitted from the second device to the first device using simple modulation.

* * * * *